(12) United States Patent
Gross et al.

(10) Patent No.: US 12,301,317 B2
(45) Date of Patent: May 13, 2025

(54) SYSTEMS, METHODS, AND DEVICES FOR WIRELESS COMMUNICATIONS INCLUDING DIGITALLY CONTROLLED EDGE INTERPOLATION (DCEI)

(71) Applicant: Intel Corporation, Santa Clara, CA (US)

(72) Inventors: Shahar Gross, Nes-Ziona (IL); Assaf Ben-Bassat, Haifa (IL)

(73) Assignee: INTEL CORPORATION, Santa Clara, CA (US)

( * ) Notice: Subject to any disclaimer, the term of this patent is extended or adjusted under 35 U.S.C. 154(b) by 313 days.

(21) Appl. No.: 17/639,351

(22) PCT Filed: Dec. 27, 2019

(86) PCT No.: PCT/US2019/068641
§ 371 (c)(1),
(2) Date: Mar. 1, 2022

(87) PCT Pub. No.: WO2021/133399
PCT Pub. Date: Jul. 1, 2021

(65) Prior Publication Data
US 2022/0338148 A1  Oct. 20, 2022

(51) Int. Cl.
*H04B 7/06* (2006.01)
*H03K 5/14* (2014.01)
*H03K 5/00* (2006.01)

(52) U.S. Cl.
CPC .............. *H04B 7/0617* (2013.01); *H03K 5/14* (2013.01); *H03K 2005/00286* (2013.01)

(58) Field of Classification Search
CPC .. H04B 7/0617; H04B 2001/045; H04B 1/04; H03K 5/14; H03K 2005/00286; H03K 5/131; H03K 2005/00052; H03F 2200/336; H03F 3/68; H03F 2200/451; H03F 3/24

See application file for complete search history.

(56) References Cited

U.S. PATENT DOCUMENTS

| 7,583,119 | B2 | 9/2009 | Song |
| 7,855,585 | B2 | 12/2010 | Gomm et al. |
| 9,137,084 | B2 * | 9/2015 | Degani ................ H04L 27/36 |
| 2005/0140416 | A1 * | 6/2005 | Rashid ................ H03K 5/133 327/277 |

(Continued)

FOREIGN PATENT DOCUMENTS

EP     2833548 A2    2/2015

OTHER PUBLICATIONS

International Search Report issued for the corresponding international patent application No. PCT/US2019/068641, dated Sep. 22, 2020, 3 pages (for informational purposes only).

(Continued)

*Primary Examiner* — Jung Kim
(74) *Attorney, Agent, or Firm* — VIERING, JENTSCHURA & PARTNER mbB; Robert M Bilotta Jr.

(57) ABSTRACT

A device for wireless communications can include a phase selector, a coarse delay line, and a digitally controlled edge interpolator (DCEI). The phase selector receives an input signal and is coupled to the coarse delay line. The coarse delay line can provide one of a plurality of delay ranges. A DCEI, connected to the coarse delay line can provide a fine delay output signal.

6 Claims, 4 Drawing Sheets

(56) References Cited

U.S. PATENT DOCUMENTS

| | | |
|---|---|---|
| 2006/0055471 A1 | 3/2006 | Roth |
| 2008/0272814 A1 | 11/2008 | Chiang et al. |
| 2011/0255867 A1 | 10/2011 | Fan et al. |
| 2014/0176213 A1 | 6/2014 | Rylov |
| 2018/0198439 A1 | 7/2018 | Hsu et al. |

OTHER PUBLICATIONS

European Search Report issued for the corresponding European patent application No. 19958054, dated Jul. 31, 2023, 11 pages (for informational purposes only).

* cited by examiner

SYSTEMS, METHODS, AND DEVICES FOR WIRELESS COMMUNICATIONS INCLUDING DIGITALLY CONTROLLED EDGE INTERPOLATION (DCEI)

RELATED APPLICATION(S)

This is a U.S. National Stage Application, filed under 35 U.S.C. § 371 of International Patent Application No. PCT/US2019/068641, filed on Dec. 27, 2019, the content of which is incorporated herein by reference in its entirety.

TECHNICAL FIELD

Various embodiments relate generally to wireless communication technologies.

BACKGROUND

Beamforming may be used in many wireless products and solutions (e.g., mobile phones notebooks, etc.), in order to improve connection range and robustness by controlling wave's interference at the receiver. Devices including beamforming transmitters usually double the amount of analog or RF components and increase the amount of digital components. Thus, the cost and power consumption of wireless devices which support beamforming of narrow modulations (such as BT, GSM, 2G, etc. . . . ) can be significant. For example, doubling of the amount of analog\RF components can consume almost 100% more power, which degrades the user-experience by shortening battery life, in addition to increasing the size of a transmitter TX chain, and thus making the device more expensive.

BRIEF DESCRIPTION OF THE DRAWINGS

In the drawings, like reference characters generally refer to the same parts throughout the different views. The drawings are not necessarily to scale; emphasis instead generally being placed upon illustrating the principles of the invention. In the following description, various embodiments of the invention are described with reference to the following drawings, in which.

DESCRIPTION

Figure 1:
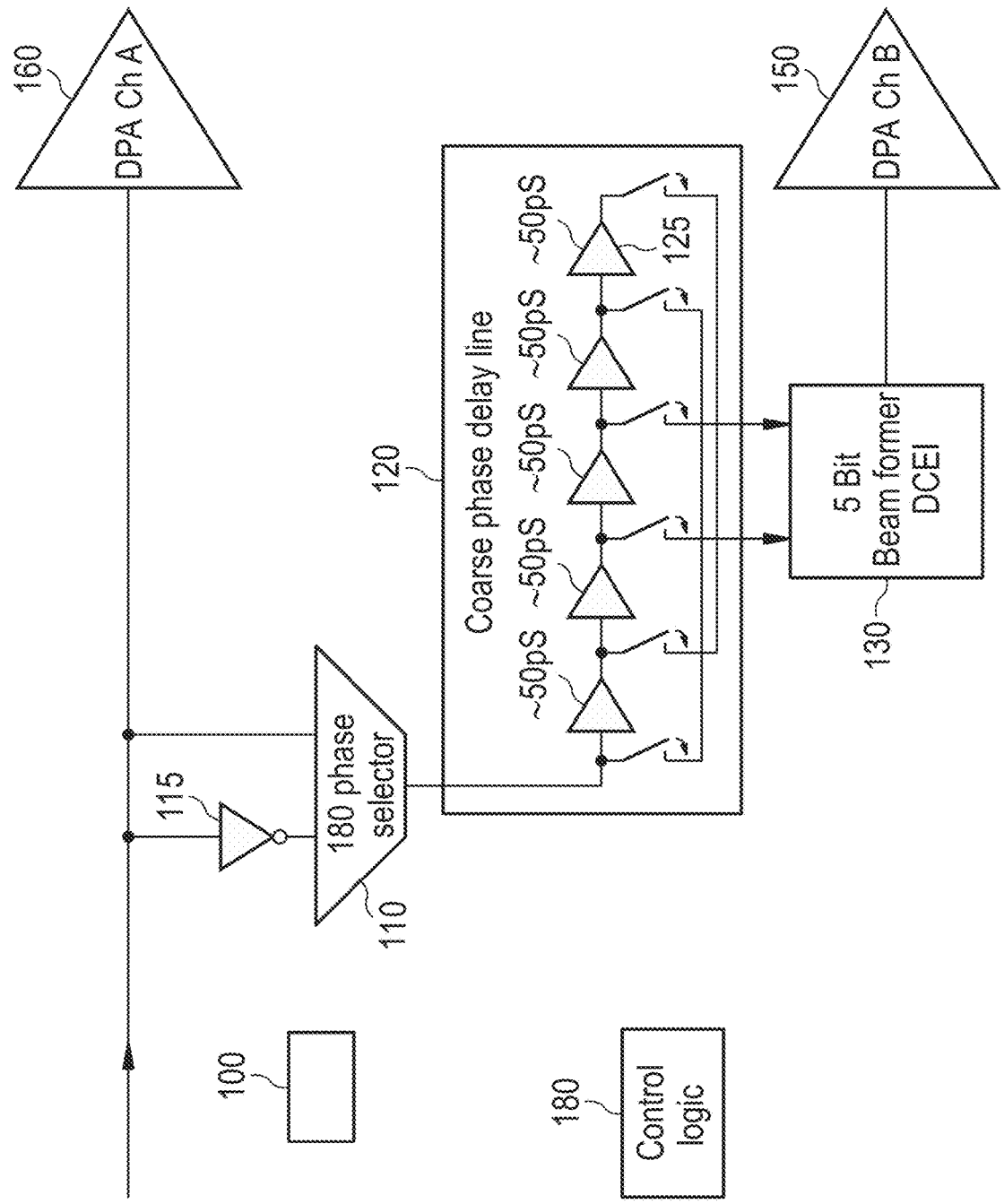
FIG. 1 shows an exemplary delay device according to at least one exemplary embodiment of the present disclosure.

The following detailed description refers to the accompanying drawings that show, by way of illustration, specific details and embodiments in which the invention may be practiced.

The word "exemplary" is used herein to mean "serving as an example, instance, or illustration." Any embodiment or design described herein as "exemplary" is not necessarily to be construed as preferred or advantageous over other embodiments or designs.

The words "plurality" and "multiple" in the description or the claims expressly refer to a quantity greater than one. The terms "group (of)", "set [of]", "collection (of)", "series (of)", "sequence (of)", "grouping (of)", etc., and the like in the description or in the claims refer to a quantity equal to or greater than one, i.e. one or more. Any term expressed in plural form that does not expressly state "plurality" or "multiple" likewise refers to a quantity equal to or greater than one. The terms "proper subset", "reduced subset", and "lesser subset" refer to a subset of a set that is not equal to the set, i.e. a subset of a set that contains less elements than the set.

As used herein, "memory" are understood as a non-transitory computer-readable medium in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, etc., or any combination thereof. Furthermore, registers, shift registers, processor registers, data buffers, etc., are also embraced herein by the term memory. A single component referred to as "memory" or "a memory" may be composed of more than one different type of memory, and thus may refer to a collective component comprising one or more types of memory. Any single memory component may be separated into multiple collectively equivalent memory components, and vice versa. Furthermore, while memory may be depicted as separate from one or more other components (such as in the drawings), memory may also be integrated with other components, such as on a common integrated chip or a controller with an embedded memory.

The term "software" refers to any type of executable instruction, including firmware.

The term "terminal device" utilized herein refers to user-side devices (both portable and fixed) that can connect to a core network and/or external data networks via a radio access network. "Terminal device" can include any mobile or immobile wireless communication device, including User Equipments (UEs), Mobile Stations (MSs), Stations (STAs), cellular phones, tablets, laptops, personal computers, wearables, multimedia playback and other handheld or body-mounted electronic devices, consumer/home/office/commercial appliances, vehicles, and any other electronic device capable of user-side wireless communications. Without loss of generality, in some cases terminal devices can also include application-layer components, such as application processors or other general processing components, that are directed to functionality other than wireless communications. Terminal devices can optionally support wired communications in addition to wireless communications. Furthermore, terminal devices can include vehicular communication devices that function as terminal devices.

The term "network access node" as utilized herein refers to a network-side device that provides a radio access network with which terminal devices can connect and exchange information with a core network and/or external data networks through the network access node. "Network access nodes" can include any type of base station or access point, including macro base stations, micro base stations, NodeBs, evolved NodeBs (eNBs), Home base stations, Remote Radio Heads (RRHs), relay points, Wi-Fi/WLAN Access Points (APs), Bluetooth master devices, DSRC RSUs, terminal devices acting as network access nodes, and any other electronic device capable of network-side wireless communications, including both immobile and mobile devices (e.g., vehicular network access nodes, mobile cells, and other movable network access nodes). As used herein, a "cell" in the context of telecommunications may be understood as a sector served by a network access node. Accordingly, a cell may be a set of geographically co-located antennas that correspond to a particular sectorization of a network access node. A network access node can thus serve one or more cells (or sectors), where the cells are characterized by distinct communication channels. Furthermore, the term "cell" may be utilized to refer to any of a macrocell, microcell, femtocell, picocell, etc. Certain communication devices can act as both terminal devices and network access nodes, such as a terminal device that provides network connectivity for other terminal devices.

Various aspects of this disclosure may utilize or be related to radio communication technologies. While some examples may refer to specific radio communication technologies, the examples provided herein may be similarly applied to various other radio communication technologies, both existing and not yet formulated, particularly in cases where such radio communication technologies share similar features as disclosed regarding the following examples.

Any of the radio links described herein may operate according to any one or more of the following radio communication technologies and/or standards including but not limited to: a Global System for Mobile Communications (GSM) radio communication technology, a General Packet Radio Service (GPRS) radio communication technology, an Enhanced Data Rates for GSM Evolution (EDGE) radio communication technology, and/or a Third Generation Partnership Project (3GPP) radio communication technology, for example Universal Mobile Telecommunications System (UNITS), Freedom of Multimedia Access (FOMA), 3GPP Long Term Evolution (LTE), 3GPP Long Term Evolution Advanced (LTE Advanced), Code division multiple access 2000 (CDMA2000), Cellular Digital Packet Data (CDPD), Mobitex, Third Generation (3G), Circuit Switched Data (CSD), High-Speed Circuit-Switched Data (HSCSD), Universal Mobile Telecommunications System (Third Generation) (UMTS (3G)), Wideband Code Division Multiple Access (Universal Mobile Telecommunications System) (W-CDMA (UMTS)), High Speed Packet Access (HSPA), High-Speed Downlink Packet Access (HSDPA), High-Speed Uplink Packet Access (HSUPA), High Speed Packet Access Plus (HSPA+), Universal Mobile Telecommunications System-Time-Division Duplex (UMTS-TDD), Time Division-Code Division Multiple Access (TD-CDMA), Time Division-Synchronous Code Division Multiple Access (TD-CDMA), 3rd Generation Partnership Project Release 8 (Pre-4th Generation) (3GPP Rel. 8 (Pre-4G)), 3GPP Rel. 9 (3rd Generation Partnership Project Release 9), 3GPP Rel. 10 (3rd Generation Partnership Project Release 10), 3GPP Rel. 11 (3rd Generation Partnership Project Release 11), 3GPP Rel. 12 (3rd Generation Partnership Project Release 12), 3GPP Rel. 13 (3rd Generation Partnership Project Release 13), 3GPP Rel. 14 (3rd Generation Partnership Project Release 14), 3GPP Rel. 15 (3rd Generation Partnership Project Release 15), 3GPP Rel. 16 (3rd Generation Partnership Project Release 16), 3GPP Rel. 17 (3rd Generation Partnership Project Release 17) and subsequent Releases (such as Rel. 18, Rel. 19, etc.), 3GPP 5G, 3GPP LTE Extra, LIE-Advanced Pro, LTE Licensed-Assisted Access (LAA), MuLTEfire, UMTS Terrestrial Radio Access (UTRA), Evolved UMTS Terrestrial Radio Access (E-UTRA), Long Term Evolution Advanced (4th Generation) (LTE Advanced (4G)), cdmaOne (2G), Code division multiple access 2000 (Third generation) (CDMA2000 (3G)), Evolution-Data Optimized or Evolution-Data Only (EV-DO), Advanced Mobile Phone System (1st Generation) (AMPS (1G)), Total Access Communication System/Extended Total Access Communication System (TACS/ETACS), Digital AMPS (2nd Generation) (D-AMPS (2G)), Push-to-talk (PTT), Mobile Telephone System (MTS), Improved Mobile Telephone System (IMTS), Advanced Mobile Telephone System (AMTS), OLT (Norwegian for Offentlig Landmobil Telefoni, Public Land Mobile Telephony), MTD (Swedish abbreviation for Mobiltelefonisystem D, or Mobile telephony system D), Public Automated Land Mobile (Autotel/PALM), ARP (Finnish for Autoradiopuhelin, "car radio phone"), NMT (Nordic Mobile Telephony), High capacity version of NTT (Nippon Telegraph and Telephone) (Hicap), Cellular Digital Packet Data (CDPD), Mobitex, DataTAC, Integrated Digital Enhanced Network (iDEN), Personal Digital Cellular (PDC), Circuit Switched Data (CSD), Personal Handy-phone System (PHS), Wideband Integrated Digital Enhanced Network (WiDEN), iBurst, Unlicensed Mobile Access (UMA), also referred to as also referred to as 3GPP Generic Access Network, or GAN standard), Zigbee, Bluetooth®, Wireless Gigabit Alliance (WiGig) standard, mmWave standards in general (wireless systems operating at 10-300 GHz and above such as WiGig, IEEE 802.11ad, IEEE 802.11 ay, etc.), technologies operating above 300 GHz and THz bands, (3GPP/LTE based or IEEE 802.11p and other) Vehicle-to-Vehicle (V2V) and Vehicle-to-X (V2X) and Vehicle-to-Infrastructure (V2I) and Infrastructure-to-Vehicle (I2V) communication technologies, 3GPP cellular V2X, DSRC (Dedicated Short Range Communications) communication systems such as Intelligent-Transport-Systems and others (typically operating in 5850 MHz to 5925 MHz), the European ITS-G5 system (i.e. the European flavor of IEEE 802.11p based DSRC, including ITS-G5A (i.e., Operation of ITS-G5 in European ITS frequency bands dedicated to ITS for safety related applications in the frequency range 5,875 GHz to 5,905 GHz), ITS-G5B (i.e., Operation in European ITS frequency bands dedicated to ITS non-safety applications in the frequency range 5,855 GHz to 5,875 GHz), ITS-G5C (i.e., Operation of ITS applications in the frequency range 5,470 GHz to 5,725 GHz)), DSRC in Japan in the 700 MHz band (including 715 MHz to 725 MHz) etc.

Aspects described herein can be used in the context of any spectrum management scheme including dedicated licensed spectrum, unlicensed spectrum, (licensed) shared spectrum (such as LSA=Licensed Shared Access in 2.3-2.4 GHz, 3.4-3.6 GHz, 3.6-3.8 GHz and further frequencies and SAS=Spectrum Access System in 3.55-3.7 GHz and further frequencies). Applicable spectrum bands include IMT (International Mobile Telecommunications) spectrum as well as other types of spectrum/bands, such as bands with national allocation (including 450-470 MHz, 902-928 MHz (note: allocated for example in US (FCC Part 15)), 863-868.6 MHz (note: allocated for example in European Union (ETSI EN 300 220)), 915.9-929.7 MHz (note: allocated for example in Japan), 917-923.5 MHz (note: allocated for example in South Korea), 755-779 MHz and 779-787 MHz (note: allocated for example in China), 790-960 MHz, 1710-2025 MHz, 2110-2200 MHz, 2300-2400 MHz, 2.4-2.4835 GHz (note: it is an ISM band with global availability and it is used by Wi-Fi technology family (11b/g/n/ax) and also by Bluetooth), 2500-2690 MHz, 698-790 MHz, 610-790 MHz, 3400-3600 MHz, 3400-3800 MHz, 3.55-3.7 GHz (note: allocated for example in the US for Citizen Broadband Radio Service), 5.15-5.25 GHz and 5.25-5.35 GHz and 5.47-5.725 GHz and 5.725-5.85 GHz bands (note: allocated for example in the US (FCC part 15), consists four U-NII bands in total 500 MHz spectrum), 5.725-5.875 GHz (note: allocated for example in EU (ETSI EN 301 893)), 5.47-5.65 GHz (note: allocated for example in South Korea, 5925-7125 MHz and 5925-6425 MHz band (note: under consideration in US and EU, respectively. Next generation Wi-Fi system is expected to include the 6 GHz spectrum as operating band but it is noted that, as of December 2017, Wi-Fi system is not yet allowed in this band. Regulation is expected to be finished in 2019-2020 timeframe), IMT-advanced spectrum, IMT-2020 spectrum (expected to include 3600-3800 MHz, 3.5 GHz bands, 700 MHz bands, bands within the 24.25-86 GHz range, etc.), spectrum made available under FCC's "Spectrum Frontier" 5G initiative (including 27.5-28.35 GHz, 29.1-29.25 GHz, 31-31.3 GHz, 37-38.6 GHz, 38.6-40 GHz, 42-42.5 GHz, 57-64 GHz, 71-76 GHz, 81-86 GHz and 92-94 GHz, etc), the ITS (Intelligent Transport Systems) band of 5.9 GHz (typically 5.85-5.925 GHz) and 63-64 GHz, bands currently allocated to WiGig such as WiGig Band 1 (57.24-59.40 GHz), WiGig Band 2 (59.40-61.56 GHz) and WiGig Band 3 (61.56-63.72 GHz) and WiGig Band 4 (63.72-65.88 GHz), 57-64/66 GHz (note: this band has near-global designation for Multi-Gigabit Wireless Systems (MGWS)/WiGig. In US (FCC part 15) allocates total 14 GHz spectrum, while EU (ETSI EN 302 567 and ETSI EN 301 217-2 for fixed P2P) allocates a total 9 GHz spectrum), the 70.2 GHz-71 GHz band, any band between 65.88 GHz and 71 GHz, bands currently allocated to automotive radar applications such as 76-81 GHz, and future bands including 94-300 GHz and above. Furthermore, the scheme can be used on a secondary basis on bands such as the TV White Space bands (typically below 790 MHz) wherein particular the 400 MHz and 700 MHz bands are promising candidates. Besides cellular applications, specific applications for vertical markets may be addressed such as PMSE (Program Making and Special Events), medical, health, surgery, automotive, low-latency, drones, etc. applications.

Aspects described herein can also implement a hierarchical application of the scheme is possible, e.g., by introducing a hierarchical prioritization of usage for different types of users (e.g., low/medium/high priority, etc.), based on a prioritized access to the spectrum e.g. with highest priority to tier-1 users, followed by tier-2, then tier-3, etc. users, etc.

Exemplary embodiments of the present disclosure can be realized by one or more computers (or computing devices) reading out and executing computer-executable instructions recorded on a storage medium (e.g., non-transitory computer-readable storage medium) to perform the functions of one or more of the herein-described embodiment(s) of the disclosure. The computer(s) may comprise one or more of a central processing unit (CPU), a microprocessing unit (MPU), or other circuitry, and may include a network of separate computers or separate computer processors. The computer-executable instructions may be provided to the computer, for example, from a network or a non-volatile computer readable storage medium. The storage medium may include, for example, one or more of a hard disk, a random-access memory (RANI), a read-only memory (ROM), a storage of distributed computing systems, an optical drive (such as a compact disc (CD), digital versatile disc (DVD), or Blu-ray Disc (BD), a flash memory device, a memory card, and the like. By way of illustration, specific details and embodiments in which the disclosure may be practiced or implemented.

Various exemplary embodiments of the present disclosure relate to time shifting. For example, BT operates in 2.4 GHz which means the phase delay should support a maximal delay of ~420 pS (which represents 360 degrees). Further, a required phase accuracy for achieving beamforming gain may be 2 degrees.

FIG. 1 shows according to an exemplary embodiment, an exemplary delay device 100. The device 100 may be included in a radio as part of transmitter implementing beam forming of narrow modulations, such as, for example, Bluetooth (BT), Global System for Mobile Communications (GSM), 2G, etc. Beamforming transmitters may be used to improve connection range and robustness by controlling interference of signals at a receiver. The device 100 may be used only to delay a signal. For example, the delay device 100 may be used to delay a signal from a first chain, chain A. Chain A may be the reference channel, and a second chain, chain B, will be delayed compared to it. Delay mismatch of a single local oscillator cycle may be negligible in very narrow transmission, such as BT.

As shown the device 100 may be configured to implemented time shifting or phase shifting. The device 100 may include a phase selector 110, a coarse delay line 120, and a digitally controlled edge interpolator (DCEI) 130. As shown, the phase selector 110 is coupled or connected to the coarse delay line 120, which in turn is coupled or connected to the DCEI. The device 100 may be considered as a digital-to-time converter (DTC).

The phase selector 110, may be a 180-degree phase selector circuit that is configured to receive a signal. The phase selector or phase selector circuit 110 may receive as input that is a signal, e.g., a phase modulated signal. Specifically, in the example of FIG. 1, the input is a phase modulated signal and inversion of the phase modulated signal. For an example, an inverter 115 may be used.

The phase selector 110 can selectively output a first signal. Specifically, the phase selector 110 may select and output the first signal if a required time shift or phase for the first signal meets certain criterial. As such, the phase selector 110 may be used to narrow down or limit the needed range for delays, such as in the context of Bluetooth example, from 420 pS to 210 pS.

The phase selector 110 may be configured to select a signal and transmit or send the selected signal in response to determining whether certain condition(s) are met. That is, the phase selector 110 may be configured to select a signal to output, in response to determining a required phase delay is smaller or larger than a certain amount. In one example, the device 100 may be implemented or incorporated into a transmitted with a local oscillator (LO). In such a case, the phase selector 110 may select a delay if the required or needed delay for the phase modulated signal is smaller or larger than the half the period (T) of a single LO cycle, or (T/2). This determination may be based on or in response to a signal the phase selector receives from control logic 180, which is further discussed later.

The coarse delay line 120 may include or realized as delay line having a serial chain of buffers 125. The coarse delay line 120 may be configured to provide a plurality of selectable delay ranges. In the example of FIG. 1, the coarse delay line 120 may include five buffers with a resolution of approximately or substantially 50 picoseconds pS), and thus may provide five different possible delay ranges. That is, the coarse delay line 120 may provide or output a selected delay, e.g., from approximately 50 pS to approximately 200 pS. A control signal, e.g., from the control logic 180 can select the delay to be implemented or provided by the coarse delay line 120.

The use of "approximately" may be used herein to denote the amount of delay provided to account for variations provided by the devices and may be within the device tolerances.

The DCEI 130 shown in the example of FIG. 1 is coupled to the output of the coarse delay line. The DCEI 130 receives the selected coarse delay from the coarse delay line. The DCEI 130 is configured to output a fine delay output based on the delay output obtained from the coarse delay line. The DCEI may apply or provide a fine delay output with a certain resolution based on a control signal from control logic 180.

In FIG. 1, the DCEI may operate by selecting edges from the coarse delay line or coarse delay line output and interpolate between the selected edges so as to provide a fine delay. As shown in FIG. 1, the input and output of each buffer may be selectable provided or coupled to input of the DCEI 130. Accordingly, the DCEI 130 obtains or receives two edges corresponding to the buffers selected to provide the coarse delay.

In the example of FIG. 1 the DCEI 130 may have 5 bits so that the delay device 100 can provide a delay with a resolution of 1.5 pS (50 pS/2^5). As such, the delay device 100 may provide a delayed output that shifts the phase and which may be used as input to at least one component of a beamforming transmitter, e.g., a beamformer using narrow single carrier modulations. For example, the time shifted or phase delayed output of the DCEI 130 may feed an amplitude modulator, e.g., an amplitude modulator of a digital power amplifier (DPA) 150. Thus, the signal fed to the DPA 160 is time shifted with respect to the signal fed to DPA 160.

The output of the delay device 100 may provide a phase delayed signal with a time shift equal to $\Delta t=(\phi/2\pi)*T$, where $\phi$ is a phase of the signal received by the phase selector device. The components of the device 100, e.g., the phase selector 110, the coarse delay line 120, and the DCEI 130 may each receive a static control signal during a transmission.

In one or more exemplary embodiments, the delay device 100 may include or may be connected or coupled to control logic, represented by control logic 180. The control logic 180 may receive input, such as a clock signal and/or a derivative of a clock signal. The clock signal may be or may be based on a signal from a local oscillator (not shown). The control logic 180 may be hardware or software or a combination of hardware and software, and may include one or more processors. The control logic 180 may output one or more control signals to the components of the delay device 100, e.g., control signals to the phase selector 110, the coarse delay line 120, and the DCEI 130. The control logic may indicate and control the operation of such components of the delay device, e.g., to indicate how much actual phase delay to be implemented or realized based on the control signal(s) sent to the components. For example, the phase selector 110 may only send or pass the signal, e.g., phase signal, based on the input from the control signal. For example, the control logic 180 may send one or more signals indicating a delay needed for the signal (e.g., at one or more times) to the phase selector 110 or may send other related indications or information to control or influence operation of the phase selector 180. Further, the coarse delay line 120 may implement one of the plurality of selectable delays based on one or more signals received from the phase selector. That is, one of the plurality of selectable delays is selected and implemented based on a control signal received from control logic 180.

Figure 2:
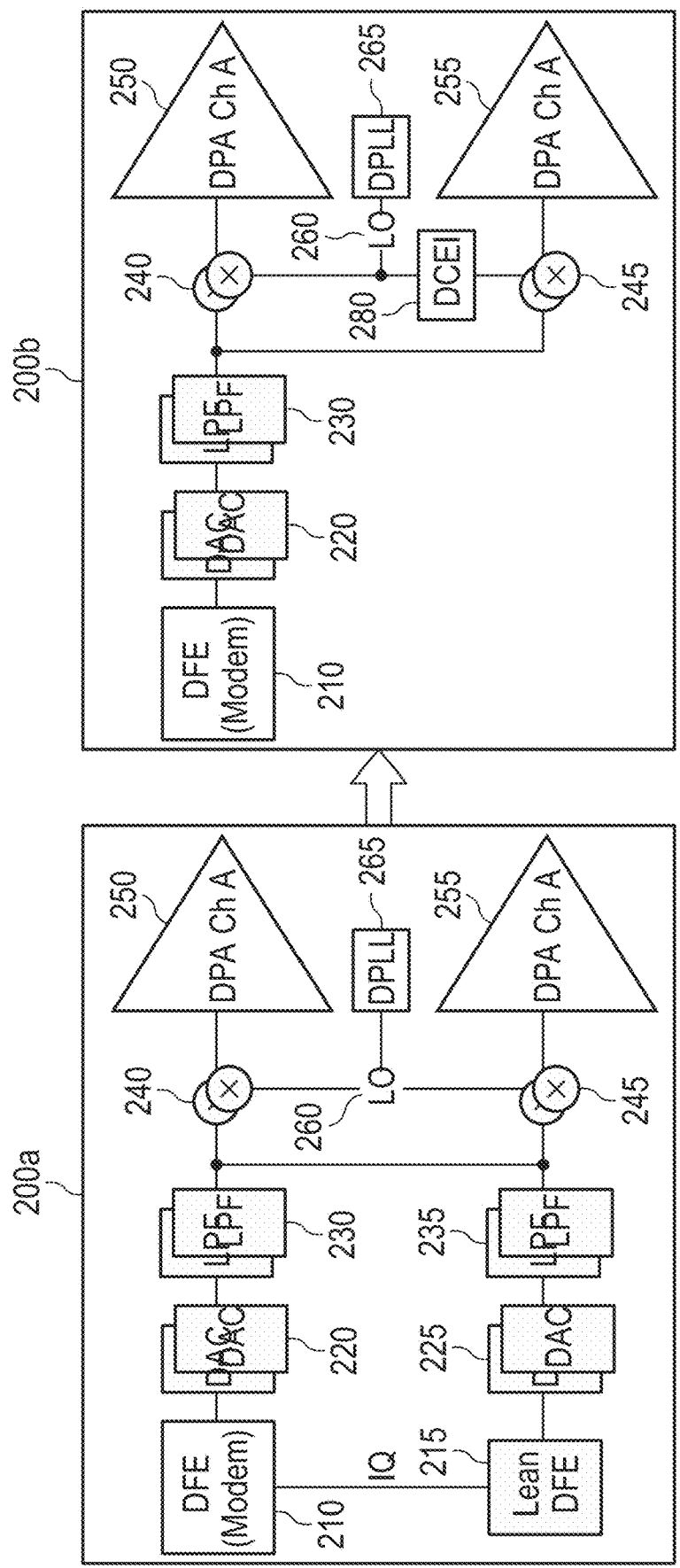
FIGS. 2-3 depict exemplary communication devices according to at least one exemplary embodiment of the present disclosure.
Figure 3:
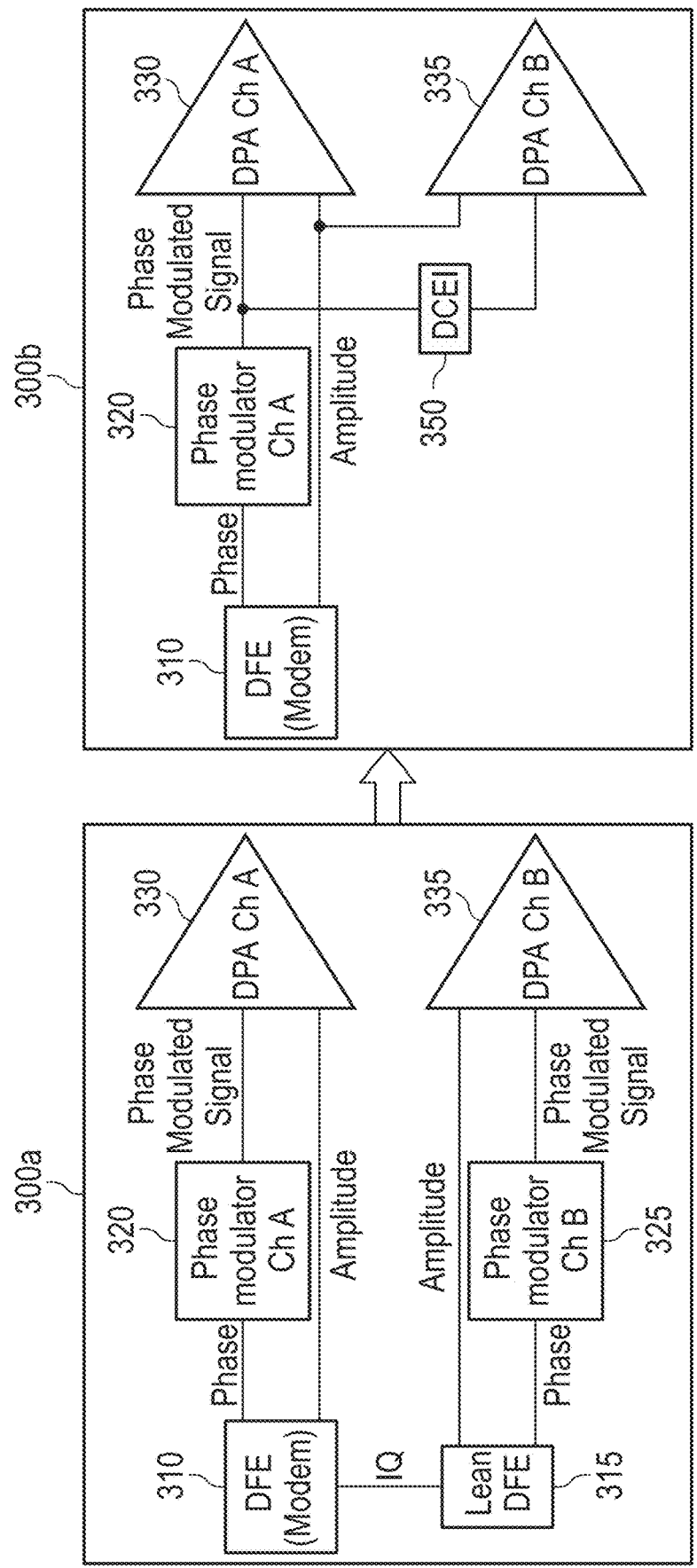

FIGS. 2 and 3 show various beamforming transmitters. FIG. 2 shows a traditional analog IQ transmitter 200a and IQ transmitter 200b according to one or more exemplary embodiments of the present disclosure. FIG. 3 shows a traditional polar transmitter 300a and a polar transmitter 300b according to one or more exemplary embodiments of the present disclosure. These beamformer transmitters may be configured for narrow single carrier modulations. Such beamformers may implemented with a single-tap channel between a pair of chains, and using only phase only in some cases. In at least one embodiment, the transmitters in FIGS. 2 and 3 may be used for Bluetooth and may operate at 2.4 GHz.

The transmitter 200a may include digital front end components 205, which can include a digital modem, which may be coupled to a digital-to-analog converter (DAC) 210, which is connected or coupled to at least one low-pass filter (LPF) 220. The LPF 230 is connected to a mixer 240. The mixer 220 output is coupled to a first digital power amplifier DPA 250. These components may be considered as part of a first or reference chain of the transmitter 200a.

In the example of FIG. 2, the transmitter 200a includes a second chain including further or lean digital front end devices or components 215 receive input from the DFE 210 of the first chain. The lean DFE 215 may include a subset of the components of the DFE 210. For example, the DFE 215 may only need to implement power control and other small features whereas the DFE 210 may be a full digital front end or digital signal processor (DSP) that may need to generate a signal from bits, upsample, and pre-process. The DFE 215 may be further coupled to a second DAC 225 which provides an output to a second LPF 235 which is connected and provides an output to a second mixer 245. The mixer 245 can provide an output to the second DPA 245. The second chain, thus, may include the DFE 215, the DAC 225, the LPF 235, the mixer 245, and the DPA 255. A local oscillator (LO) 260 connected to a digital phase-locked loop (DPLL) 265 may provide an output to the first mixer 240 and the second mixer 245.

In the example of FIG. 2, the beamforming transmitter 200b is similar to the transmitter 200a or in other words, has some of the same components. A difference is that the transmitter 200b does not have portions of the second chain have been removed because they are not needed. That is the transmitter 200b does not have nor need the DFE 215, the second DAC 225, and the second LPF 235.

In contrast to the transmitter 200a, the transmitter 200b includes a delay device 280, such as the delay device 100 of FIG. 1. As shown in the example of FIG. 2, the delay device may be coupled between the first and second chains, e.g., between the first DPA 250 and the second DPA 255. The delay device 280 may receive as input, a signal from the LO 260 and is configured to time shift the received signal. As shown, the delay device 280 provides the time-shifted signal to the mixer 245. The mixer 245 mixes the time-shifted signal with an input from the first chain (a phase modulated signal from the first chain, e.g., from the output of the LPF 230) and provides an output to the second DPA 255. Accordingly the signal inputted to the second DPA 255 is time-shifted or phase-delayed signal version of the signal inputted to the first DPA 250.

Referring to FIG. 3, the polar transmitter 300a includes digital front end (DFE) components/circuits 310, which includes a digital modem. The DFE 310 may output a phase signal and an amplitude signal. The amplitude signal may be provided to the first digital power amplifier (DPA) 330. Further, the phase signal may be outputted to a first phase modulator 320. The first phase modulator 320 provides a phase modulated signal, based on the phase signal input, to the DPA 330. The DFE 310, the phase modulator 320, and the DPA 330 may be considered as part of a first or reference chain of the transmitter 300a.

The transmitter 300a first includes a second chain, which includes lean DFE 315. The lean DFE may receive input from the DFE 310, e.g., from the modem of the DFE 310. The DFE 315 may be configured to provide or output an amplitude signal and a phase signal. The amplitude signal may be provided to a second DPA 335. The phase signal may be provided as input to a second phase modulator 325. The second phase modulator 325 provides a phase modulated signal, based on the phase signal input, to the DPA 330. The lean DFE 315, the second phase modulator 325, and the second DPA 335 may be considered as part of the second chain of the transmitter 300*a*.

In the example of FIG. 3, the beamforming transmitter 300*b* is similar to the transmitter 300*a*. However, the transmitter 300*b* does not have because it does not require certain components or devices included in the transmitter 300*a*.

As shown in FIG. 3, the transmitter 300*b* does not have or include the lean DFE 315 and the second phase modulator 325. Further, the transmitter 300*b* includes a delay device 350. The delay device 350 may be the same or similar to the time shifting or phase delaying device 100 of FIG. 1. The delay device 350, in at least one embodiment, may be coupled the first and second chains of the transmitter 300*b*, e.g., between the first DPA 330 and the second DPA 335. The delay device 350 may receive as input, the phase modulated signal outputted or provided by the first phase modulator 320. The delay device 350 provides a signal to the second DPA 335 which is the phase delayed or time shifted version of the phase modulated signal provided by the first phase modulator 320 to the first DPA 330.

Figure 4:
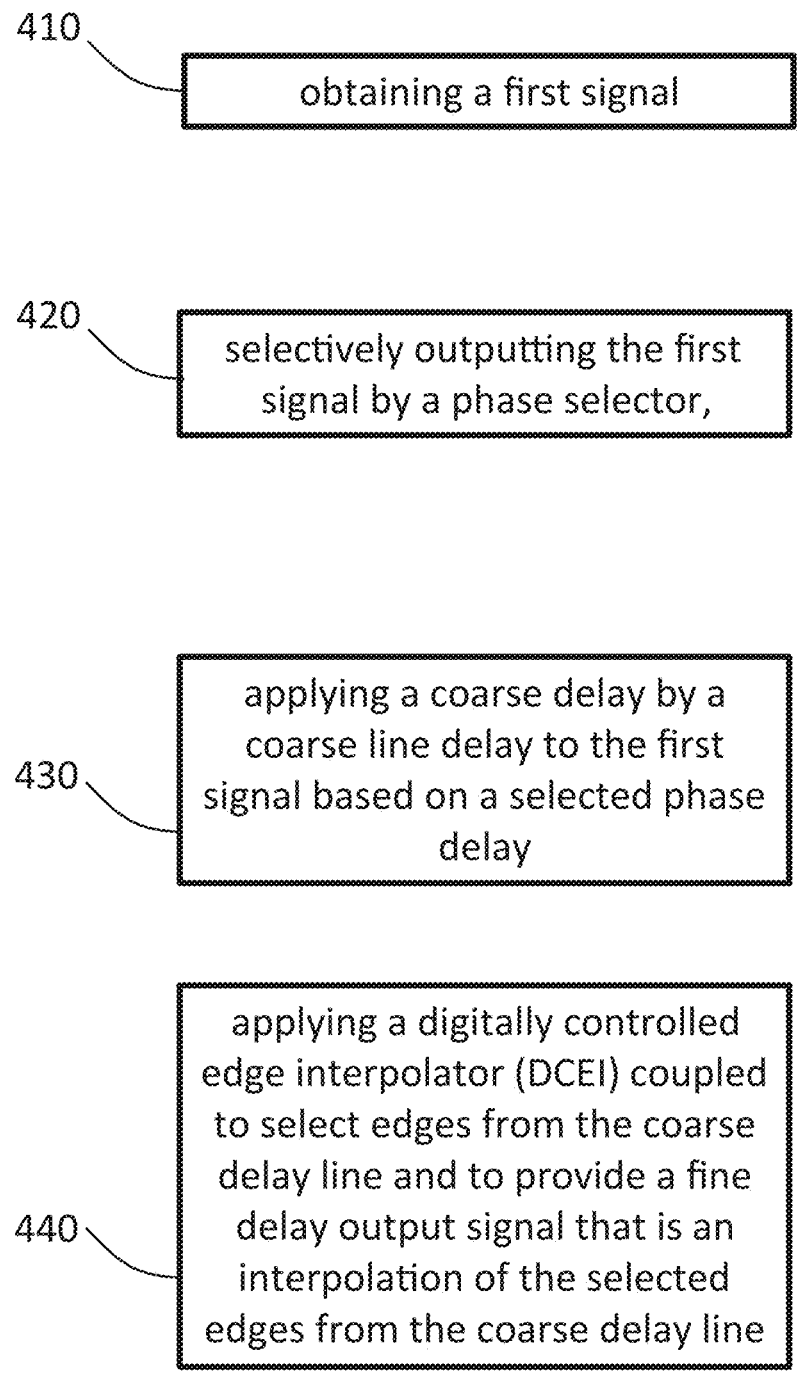
FIG. 4 shows an exemplary process according to at least one exemplary embodiment of the present disclosure.

FIG. 4 shows a method for generating a time shifted or phase delayed signal according to at least one exemplary embodiment of the present disclosure. The method may be performed by or with the components and/or devices described herein.

At 410, the method may include obtaining a first signal (e.g. a phase signal), and at 420; selectively outputting the signal, by a phase selector. The phase selector may select the obtained first signal based in part on an input control signal, which may indicate the required delay for the first signal. The phase selector may output the first signal if the required delay is less than or greater than a threshold value. The threshold condition may be met if a required delay for the first signal is less than or equal to half a period cycle of a local oscillator. The phase selectors herein may be any suitable phase detector known in the art and may include any combination of hardware and software including one or more processors to execute instructions.

At 415, the method may further include applying a coarse delay, by a coarse delay line, to the first signal obtained from the phase selector based on a selected phase delay. The phase delay or time shift may be selected by a control input, e.g. control input signal received by the coarse delay line. The coarse delay may be applied by a coarse delay line including a plurality of buffers. The control input signal (e.g., from control logic) may select the amount of delay from a predetermine set of delays or delay ranges. That is, the coarse delay can provide one of a plurality of selectable delays or delay ranges, after being is selected by the control input.

The method at 420 can further include applying a digitally controlled edge interpolator (DCEI) coupled to select edges from the coarse delay line and to provide a fine delay output signal that is an interpolation of the selected edges from the coarse delay line. The method may provide a fine delay output signal that produces a time shift equal to $\Delta t = (\phi/2\pi) \cdot T$, where T is equal to a period of the cycle of the local oscillator.

In accordance with various embodiments of the present disclosure, a device such as the delay device 100 may very small and integrated on a single chip with the other RF components, e.g., the DPAs, the mixers, phase modulators, etc. Further, the delay device may only consume a small amount of current such as approximately 2-3 milliamps.

The following examples pertain to further aspects of this disclosure:

Example 1 is a time shifting device including a phase selector device to selectively output a received input signal; a coarse delay line coupled to the phase selector device to provide a coarse delay; and a digitally controlled edge interpolator (DCEI) coupled to the coarse delay device and configured to output a fine delay output based on the provided coarse delay.

Example 2 is the time shifting device of Example 1, wherein the phase selector device is a 180 degree phase selector and wherein the input includes the signal and an inversion of the signal.

Example 3 is the time shifting device of Example 1 or 2, wherein the phase selector device is further configured to selectively output the received input signal to the coarse delay line.

Example 4 is the time shifting device of Example 3, wherein the coarse delay line is configured to provide a phase delay to the output signal from phase selector device based on a received control input.

Example 5 is the time shifting device of Example 3 or 4, wherein the phase selector is configured to selectively output the first signal in response to a control signal, wherein the control signal indicates a required phase delay for the first signal and the phase selector outputs the first signal in response to the determined required phase delay being less than or greater than T/2, and wherein T is a period of a single cycle of a local oscillator coupled to the time shifting device.

Example 6 is the time shifting device of any of Examples 1 to 5, wherein the coarse delay line includes a plurality of serially connected buffers so to provide one plurality of selectable delay ranges to the output signal of the phase selector.

Example 7 is the time shifting device of Example 6, wherein each buffer is configured to provide a same delay.

Example 8 is the time shifting device of Example 7, wherein the same delay is substantially 50 picoseconds.

Example 9 is the time shifting device of Example 5, wherein an input and an output of each buffer of the coarse delay line is coupled to the DCEI.

Example 10 is the time shifting device of Example 5, wherein the time shifting device provides a time shift equal to $\Delta t = (\phi/2\pi) \cdot T$, where $\phi$ is a phase of the signal received by the phase selector device.

Example 11 is a beamforming transmitter including a first digitally controlled power amplifier (DCPA); a second DCPA; a time shifting device coupled between the first DCPA and the second DCPA, the delay device including: a phase selector device to selectively output a first signal; a coarse delay line coupled to the phase selector device and to provide a coarse delay; and a digitally controlled edge interpolator (DCEI) coupled to the coarse delay device and configured to output a fine delay output based on the provided coarse delay.

Example 12 is the beamforming transmitter of Example 11, wherein the beamforming transmitter is an analog IQ beamforming transmitter, the analog IQ beamforming transmitter further including: a local oscillator; a first mixer to mix a first phase modulated signal and a signal from the local oscillator, the first mixer to provide an output to the first DCPA; a second mixer to mix the first phase modulated signal and the output of the delay device, the second mixer to provide an output to the second DCPA.

Example 13 is the beamforming transmitter of Example 12, the beamforing transmitter further including: a digital front end comprising a digital modem; a digital to analog converter (DAC) to receive input from the digital front end; and a low pass filter to receive an input form the DAC and provide as an output the first phase modulated signal.

Example 14 is the beamforming transmitter of any of Examples 11 to 13, wherein the beamforming transmitter is a polar beamforming transmitter, the polar beamforming transmitter further including: a phase modulator providing a first phase modulated signal to the first DCPA and to the phase selector device of the delay device; wherein the DCEI of the delay device provides an output to the second DCPA.

Example 15 is the beamforming transmitter of any of Examples 11 to 14, further including a digital front end comprising a digital modem, the digital modem to provide a phase output to the phase modulator and further to provide an amplitude signal output to the first DCPA and the second DCPA.

Example 16 is a method for generating a time shifted signal, the method including: obtaining a first signal; selecting, by a phase selector, a first signal to output; applying a coarse delay by a coarse line delay to the selected first signal outputted by the phase selector; and applying a digitally controlled edge interpolator (DCEI) coupled to select edges from the coarse delay device and to provide a fine delay output signal that is an interpolation of the selected edges from the coarse delay line.

Example 17 is the method of Example 16, wherein the coarse delay provides one of a plurality of selectable delay ranges based on a control input.

Example 18 is the method of Example 16 or 17, wherein selecting the first signal to output includes selecting the first signal in response to a control input indicating a required delay for the first signal and wherein the required delay is less than or equal to half a period cycle of a local oscillator.

Example 19 is the method of Example 18, wherein the fine delay output signal provides a time shift equal to $\Delta t=(\phi/2\pi)*T$, where T is equal to a period of the cycle of the local oscillator.

Example 20 is a time delay device, the device including means for selecting a input signal to output based on a required delay for the input signal; means for providing a coarse delay to the input signal based on a selected phase delay; means for providing a fine delay output signal based provided coarse delay.

Example 21 is the time delay device of Example 20, wherein the means for selecting an input signal to output include means for selecting the first signal in response to determining a required delay for the first signal is less than or equal to half a period cycle of a local oscillator.

Example 22 is the time delay device of Example 20 or 21, wherein the means for providing the coarse delay include a plurality of serially connected buffers.

Example 23 is the time delay device of any of Examples 20 to 22, wherein the means for providing a coarse delay include means for providing one of a plurality of selectable phase delay ranges.

Example 24 is the time delay device of any of Examples 20 to 23, wherein the means for providing a fine delay output include means for selecting and interpolating edges of the provided coarse delay.

It should be noted that one or more of the features of any of the examples above may be combined with any one of the other examples.

The foregoing description has been given by way of example only and it will be appreciated by those skilled in the art that modifications may be made without departing from the broader spirit or scope of the invention as set forth in the claims. The specification and drawings are therefore to be regarded in an illustrative sense rather than a restrictive sense.

The scope of the disclosure is thus indicated by the appended claims and all changes which come within the meaning and range of equivalency of the claims are therefore intended to be embraced.

What is claimed is:

1. A beamforming transmitter comprising:
   a first digitally controlled power amplifier (DCPA);
   a second DCPA;
   a time shifting device coupled between the first DCPA and the second DCPA, the time shifting device comprising:
      a phase selector device to receive a first signal and selectively output the first signal;
      a coarse delay line coupled to the phase selector device and to provide a coarse delay; and
      a digitally controlled edge interpolator (DCEI) coupled to the coarse delay device and configured to output a fine delay output based on the provided coarse delay.

2. The beamforming transmitter of claim 1, wherein the beamforming transmitter is an analog IQ beamforming transmitter, the analog IQ beamforming transmitter further comprising:
   a local oscillator;
   a first mixer to mix a first phase modulated signal and a signal from the local oscillator, the first mixer to provide an output to the first DCPA;
   a second mixer to mix the first phase modulated signal and the output of the delay device, the second mixer to provide an output to the second DCPA.

3. The beamforming transmitter of claim 2, further comprising:
   a digital front end comprising a digital modem;
   a digital to analog converter (DAC) to receive input from the digital front end; and
   a low pass filter to receive an input form the DAC and provide as an output the first phase modulated signal.

4. The beamforming transmitter of claim 1, wherein the beamforming transmitter is a polar beamforming transmitter, the polar beamforming transmitter further comprising:
   a phase modulator providing a first phase modulated signal to the first DCPA and to the phase selector device of the delay device;
   wherein the DCEI of the delay device provides an output to the second DCPA.

5. The beamforming transmitter of claim 1 further comprising:
   a digital front end comprising a digital modem, the digital modem to provide a phase output to the phase modulator and further to provide an amplitude signal output to the first DCPA and the second DCPA.

6. The beamforming transmitter of claim 1, wherein the beamforming transmitter is a Bluetooth transmitter.

* * * * *